United States Patent
Park et al.

(10) Patent No.: US 7,834,953 B2
(45) Date of Patent: Nov. 16, 2010

(54) LIGHT UNIT, LIQUID CRYSTAL DISPLAY HAVING THE SAME, AND METHOD OF MANUFACTURING THE SAME

(75) Inventors: Hae-Il Park, Seoul (KR); Jin-Seob Byun, Seoul (KR); Jae-Byung Park, Sungnam-si (KR); Sung-Jin Hong, Seoul (KR); Don-Chan Cho, Sungnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 79 days.

(21) Appl. No.: 12/265,183

(22) Filed: Nov. 5, 2008

(65) Prior Publication Data

US 2009/0213296 A1 Aug. 27, 2009

(30) Foreign Application Priority Data

Feb. 25, 2008 (KR) ...................... 10-2008-0016811

(51) Int. Cl.
*G02F 1/1335* (2006.01)
*H01L 33/00* (2010.01)

(52) U.S. Cl. .................. 349/62; 349/71; 349/187; 313/501; 438/22; 257/E33.061

(58) Field of Classification Search ................ 349/69, 349/2, 27, 28, 50, 61, 62, 92, 93, 138, 166, 349/187, 189, 190, 71; 313/501; 438/22; 257/E33.061
See application file for complete search history.

(56) References Cited

U.S. PATENT DOCUMENTS

| | | | |
|---|---|---|---|
| 7,518,160 B2* | 4/2009 | Fukudome et al. | 257/98 |
| 7,569,406 B2* | 8/2009 | Keller et al. | 438/27 |
| 2007/0096128 A1* | 5/2007 | Fukudome et al. | 257/98 |
| 2008/0231170 A1* | 9/2008 | Masato et al. | 313/501 |
| 2009/0213296 A1* | 8/2009 | Park et al. | 349/62 |

* cited by examiner

*Primary Examiner*—Brian M Healy
(74) *Attorney, Agent, or Firm*—F. Chau & Associates, LLC (57) ABSTRACT

A light unit includes a light emitting chip emitting light, a light conversion layer disposed on the light emitting chip, and the light conversion layer including a resin layer and semiconductor particles distributed on the resin layer, and a buffer layer interposed between the light emitting chip and the light conversion layer.

19 Claims, 11 Drawing Sheets

LIGHT UNIT, LIQUID CRYSTAL DISPLAY HAVING THE SAME, AND METHOD OF MANUFACTURING THE SAME

CROSS-REFERENCE TO RELATED APPLICATION

This application claims priority from Korean Patent Application No. 10-2008-0016811, filed on Feb. 25, 2008, the disclosure of which is incorporated herein in its entirety by reference.

BACKGROUND OF THE INVENTION

1. Technical Field

The present disclosure relates to a light unit, a liquid crystal display having the same, and a method of manufacturing the same, and more particularly to a light unit, a liquid crystal display having the same, and a method of manufacturing the same, wherein the light unit includes a light conversion layer and a buffer layer.

2. Discussion of Related Art

Types of flat display devices include a plasma display panel (PDP), a plasma address liquid crystal display panel (PALC), a liquid crystal display (LCD), and an organic light emitting diode (OLED).

A liquid crystal display (LCD) is a flat panel display (FPD) having two substrates, on which electrodes are formed, and a liquid crystal layer interposed between the two substrates. Liquid crystal molecules of the liquid crystal layer are rearranged by a voltage applied to the electrodes, and thus the quantity of transmitted light is adjusted, so that an image is displayed.

Since the liquid crystal display is a passive display device, a backlight assembly for providing light passing through the liquid crystal layer is used. Light sources for use in the backlight assembly include, for example, a cold cathode fluorescent lamp (CCFL), a hot cathode fluorescent lamp (HCFL), and a quantum dot light emitting diode (QD-LED). The QD-LED can improve the color reproduction by using a nano-size semiconductor material. The QD-LED can control the wavelength of the emitted light by adjusting the constitution, size, and shape of the nano-size semiconductor material, and thus can provide wide color reproduction. The QD-LED is manufactured by mixing resin with first semiconductor particles for converting the blue light into red light and second semiconductor particles for converting the blue light into green light, and curing the resin mixed with the first and second semiconductor particles. However, the heat and blue light generated during the driving of the QD-LED may cause darkening in the QD-LED.

SUMMARY OF THE INVENTION

According to an exemplary embodiment of the present invention, a light unit includes a light emitting chip emitting light, a light conversion layer disposed on an upper part of the light emitting chip, and including a resin layer and semiconductor particles distributed on the resin layer to convert a wavelength of light in accordance with their size, a diameter of the semiconductor particles being in the range about 1 nm to about 10 nm, and a buffer layer interposed between the light emitting chip and the light conversion layer to intercept the diffusion of heat and the light.

According to an exemplary embodiment of the present invention, a liquid crystal display includes a light unit including a light emitting chip emitting light, a light conversion layer disposed on an upper part of the light emitting chip and including a resin layer and semiconductor particles distributed on the resin layer to convert a wavelength of light in accordance with their size, a diameter of the semiconductor particles being in the range about 1 nm to about 10 nm, and a buffer layer interposed between the light emitting chip and the light conversion layer to intercept the diffusion of heat and the light, and a liquid crystal panel receiving the light and displaying an image.

According to an exemplary embodiment of the present invention, a method of manufacturing a light unit includes injecting a first liquid resin on a light emitting chip, injecting a second liquid resin that includes semiconductor particles and has lower specific gravity than the first resin on the first resin, and curing the first resin and the second resin to form a buffer layer comprising the first resin and a light conversion layer comprising the second resin by simultaneously curing the first resin and the second resin.

BRIEF DESCRIPTION OF THE DRAWINGS

Exemplary embodiments of the present invention can be understood in more detail from the following description taken in conjunction with the accompanying drawings, in which.

DETAILED DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein.

The term "on" that is used to designate that an element is on another element located on a different layer or a layer includes both a case where an element is located directly on another element or a layer and a case where an element is located on another element via another layer or still another element.

Figure 1:
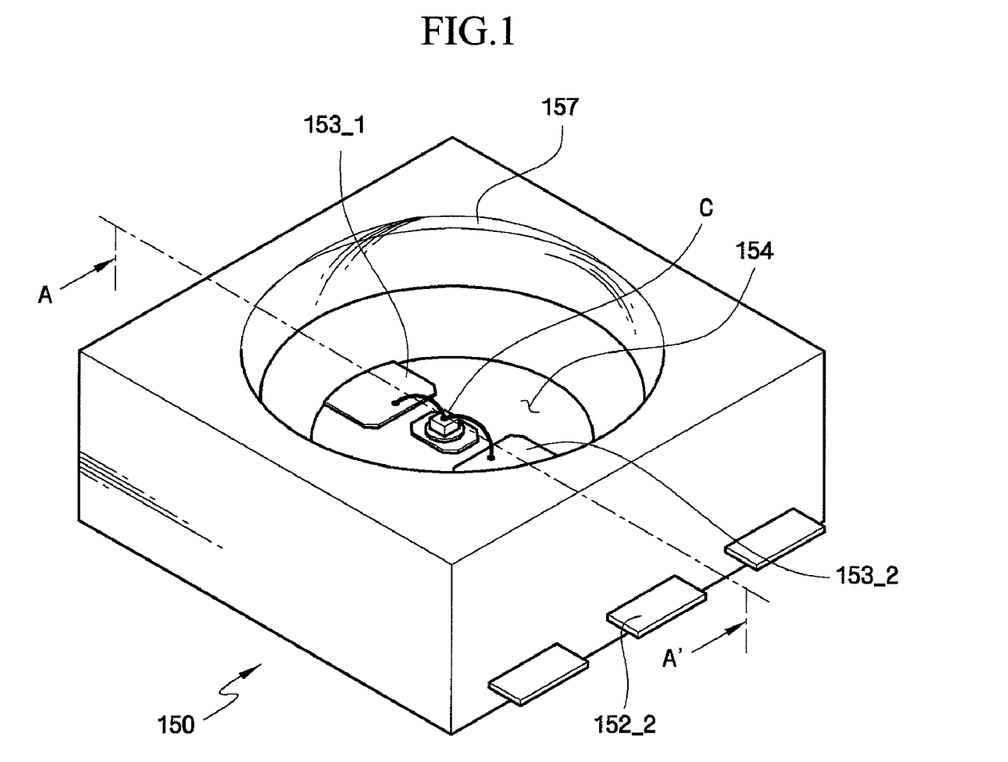
FIG. 1 is a perspective view of a light unit according to an exemplary embodiment of the present invention.
Figure 2:
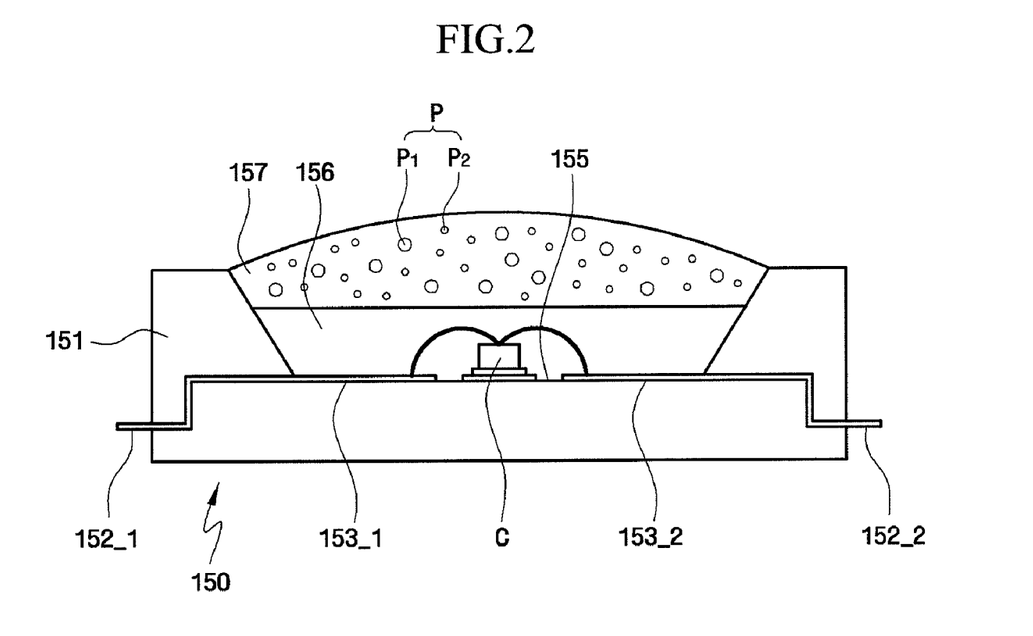
FIG. 2 is a sectional view of a light unit taken along the line A-A' in FIG. 1.

FIG. 1 is a perspective view of a light unit according to an exemplary embodiment of the present invention. FIG. 2 is a sectional view of a light unit taken along the line A-A' in FIG. 1.

The light unit 150 according to an exemplary embodiment of the present invention includes a housing 151, an accommodation groove 154, a light emitting chip C, a light conversion layer 157, a buffer layer 156, and semiconductor particles P.

The housing 151 forms a frame of the light unit 150, and has the accommodation groove 154 formed in the housing to receive the light emitting chip C therein. The housing 151 may be formed through molding by using a material such as, for example, poly phthal amide (PPA).

The accommodation groove 154 is formed so that an upper surface of the housing 151 is recessed. The light emitting chip C is formed on a bottom surface 155 of the accommodation groove 154. An upper part of the accommodation groove 154 is open to expose the light emitting chip C. The accommodation groove 154 may include an inclined surface such that the cross-sectional area of the accommodation groove is gradually widened from the bottom surface 155 to the open part of the accommodation groove 154. The inclined surface becomes a wall surface surrounding the light emitting chip C. A reflective material is coated on the inclined surface to reflect the light emitted from the light emitting chip C to an upper part of the housing 151, so that the light efficiency is improved. The longitudinal section of the inclined surface may be straight or may be curved to adjust the reflection angle.

The light emitting chip C is located on the bottom surface 155 of the accommodation groove 154, and is connected to an anode electrode 153_1 and a cathode electrode 153_2 formed on the bottom surface 155 to receive the supply voltage from the electrodes. In an exemplary embodiment, more than one light emitting chip C may be formed in the accommodation groove 154. The light emitting chip C emits light of various wavelengths in accordance with the semiconductor particles P. The light unit 150 according to an exemplary embodiment of the present invention emits blue light having the shortest wavelength in the range of visible light or light in an ultraviolet (UV) range of which the wavelength is shorter than that of the visible light. However, the light unit 150 is not limited to that as described above, and may emit light of a specified wavelength in the visible light range or light having a wavelength shorter than that of the UV rays.

The light emitted from the light emitting chip C collides with the semiconductor particles P included in the light conversion layer 157 to cause energy conversion, and thus the wavelength of the light is changed thereby changing the color of the light. For example, when a first light emitted from the light emitting chip C passes through the light conversion layer 157, the first light is converted into a second light having a different wavelength such that the color of the first light is changed.

The light conversion layer 157 comprises a second resin to transmit the light, and the second resin may be a transparent resin of, for example, a silicon-based material. In the transparent resin, nano-size semiconductor particles P for converting the wavelength of the light are included. The resin protects the light emitting chip C from an external impact, and serves as a lens for adjusting a path of the emitted light.

The semiconductor particles P enable the light emitting chip C to emit desired light by converting the wavelength of the light generated by the light emitting chip C. The semiconductor particles P are nano-size particles, and the wavelength of the light that can be converted may differ in accordance with the size of the semiconductor particles P. Accordingly, by adjusting the size of the semiconductor particles P, light of a desired color can be emitted.

The semiconductor particles P may comprise CdSe/ZnS or InGaP/CuZnS, and a diameter of the particles P can be about 1 nm to about 10 nm. That is, if the size of the semiconductor particles P is small, the wavelength of the emitted light is shortened to generate blue series light. If the size of the semiconductor particles P is large, the wavelength of the emitted light is lengthened to generate red series light.

The semiconductor particles P may form a dual structure including an inner core and an outer shell surrounding the inner core. For example, for the semiconductor particles P of a CdSe/ZnS material, the corresponding dual structure includes an inner core of CdSe and an outer shell of XnS. For the semiconductor particles P of InGaP/CuZnS material, the corresponding dual structure includes an inner core of InGaP and an outer shell of CuZnS.

When the light emitting chip C emitting blue light is used, the light conversion layer 157 can be formed by mixing the semiconductor particles $P_1$ emitting red light and the semiconductor particles $P_2$ emitting green light with resin in a proper ratio. By using the semiconductor particles P, wavelengths having a small Full Width at Half Maximum (FWHM), and thus high-purity light can be obtained without light loss. Accordingly, by using the semiconductor particles P emitting green light and red light in the blue light emitting chip C, high-purity white light, in which blue light, green light, and red light are mixed, can be obtained. That is, since the blue light, green light, and red light having a small FWHM and peak wavelengths can be obtained, the color gamut of the light unit 150 is widened and thus the color gamut expressed by the display device is widened.

A buffer layer 156 may be formed between the light emitting chip C and the light conversion layer 157. The buffer layer 156 intercepts heat generated from the light emitting chip C and disperses the light. The buffer layer 156 is formed by applying a first resin. The first resin may comprise a transparent epoxy-based material. In an exemplary embodiment, the epoxy-based material used as the buffer layer 156 has a gravity higher than that of the silicon-based material used as the light conversion layer 157. In an exemplary embodiment, the thickness of the buffer layer 156 can be about 60% to about 70% of the whole thickness of the optical conversion layer 157 and the buffer layer 156.

In an exemplary embodiment, the light conversion layer 157 and the buffer layer 156 are applied in the form of liquid resin, and are cured, for example, simultaneously, through a curing process.

On a bottom surface 155 of the accommodation groove 154, an anode electrode 153_1 and a cathode electrode 153_2 are formed. The anode electrode 153_1 and the cathode electrode 153_2 provide a power supply to the light emitting chip C. The anode electrode 153_1 and the cathode electrode 153_2 are formed through a patterning process, and are respectively connected to the anode electrode terminal 152_1 and the cathode electrode terminal 152_2 formed on an outer surface of the housing 151.

Figure 3:
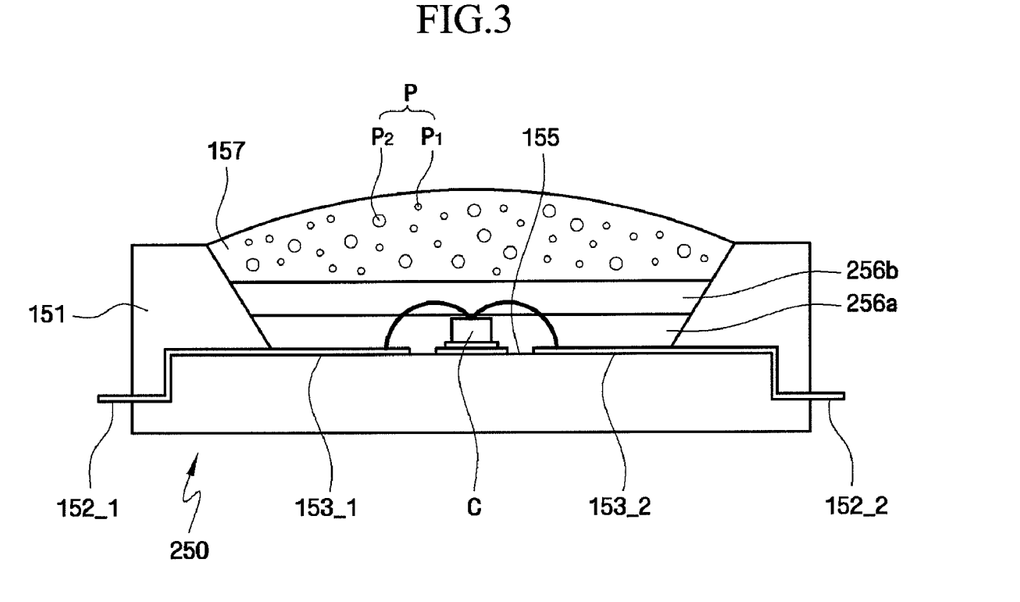
FIG. 3 is a sectional view of a light unit according to an exemplary embodiment of the present invention.

Referring to FIGS. 1 and 3, a light unit according to an exemplary embodiment of the present invention is described. FIG. 3 is a sectional view of a light unit according to an exemplary embodiment of the present invention.

The light unit 250 according to an exemplary embodiment of the present invention includes the housing 151, the accommodation groove 154, the light emitting chip C, the light conversion layer 157, a first buffer layer 256a, a second buffer layer 256b, and the semiconductor particles P. That is, the light unit 250 includes a multilayer buffer layer.

The first buffer layer 256a and the second buffer layer 256b intercept heat generated from the light emitting chip C. The first buffer layer 256a is formed on an upper part of the light emitting chip C, and intercepts the heat transferred from the light emitting chip C to the light conversion layer 157. On an upper part of the first buffer layer 256a, the second buffer layer 256b is formed. The first buffer layer 256a and the second buffer layer 256b comprise a transparent material having high heat interception efficiency.

To manufacture the first buffer layer 256a and the second buffer layer 256b through a curing process, the gravity of a material coated on the first buffer layer 256a can be higher than that of a material coated on the second buffer layer 256b. The first buffer layer 256a and the second buffer layer 256b may be formed by applying liquid resin onto the light emitting chip C.

Figure 4:
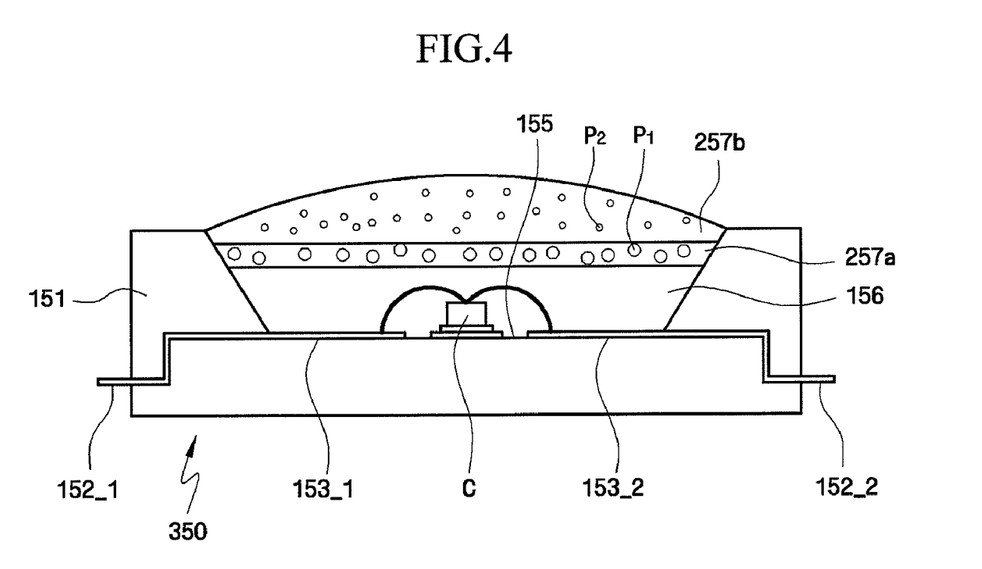
FIG. 4 is a sectional view of a light unit according to an exemplary embodiment of the present invention.

Referring to FIGS. 1 and 4, a light unit according to an exemplary embodiment of the present invention is described. FIG. 4 is a sectional view of a light unit according to an exemplary embodiment of the present invention.

The light unit 350 according to an exemplary embodiment of the present invention includes the housing 151, the accommodation groove 154, the light emitting chip C, a first light conversion layer 257a, a second light conversion layer 257b, the buffer layer 156, and the semiconductor particles P. That is, the light unit 150 includes a multilayer light conversion layer.

The light unit 350 includes the first light conversion layer 257a and the second light conversion layer 257b emitting light of different colors.

On the bottom surface 155 of the housing 151, the light emitting chip C is formed, and on the upper part of the light emitting chip C, the buffer layer 156 is formed to intercept heat generated from the light emitting chip C. On the upper part of the buffer layer 156, the first light conversion layer 257a is formed.

The first light conversion layer 257a receives blue light or ultraviolet rays from the light emitting chip C, and emits red light. The first light conversion layer 257a includes first semiconductor particles $P_1$ emitting red light. Accordingly, the light emitted from the light emitting chip C collides with the first semiconductor particles $P_1$ of the first light conversion layer 257a to emit the red light.

On the upper part of the first light conversion layer 257a, the second light conversion layer 257b is formed. The second light conversion layer 257b receives blue light or ultraviolet rays, and emits green light. The red light emitted from the first light conversion layer 257a passes through the second light conversion layer 257b as red light. The second light conversion layer 257b includes second semiconductor particles $P_2$ that can emit the green light.

A diameter of the first semiconductor particles $P_1$ included in the first light conversion layer 257a may be larger than that of the second semiconductor particles $P_2$ included in the second light conversion layer 257b. That is, the diameter of the semiconductor particles P may be about 1 nm to about 10 nm. As the diameter of the semiconductor particles P becomes smaller, light of a shorter wavelength is emitted. Accordingly, to emit the red light having a wavelength larger than that of the green light, the diameter of the first semiconductor particles $P_1$ included in the first light conversion layer 257a is larger than that of the second semiconductor particles $P_2$ included in the second light conversion layer 257b.

The specific gravity of the resin forming the first light conversion layer 257a and the second light conversion layer 257b is at least smaller than the specific gravity of the resin layer forming the buffer layer 156, and the specific gravity of the resin forming the first light conversion layer 257a is larger than the specific gravity of the resin forming the second light conversion layer 257b.

The first light conversion layer 257a and the second light conversion layer 257b are applied convexly on the housing 151 to serve as a lens.

Referring to FIGS. 5 to 11, a method of manufacturing a light unit according to an exemplary embodiment of the present invention is described. FIGS. 5 to 11 show a method of manufacturing a light unit according to an exemplary embodiment of the present invention.

Figure 5:
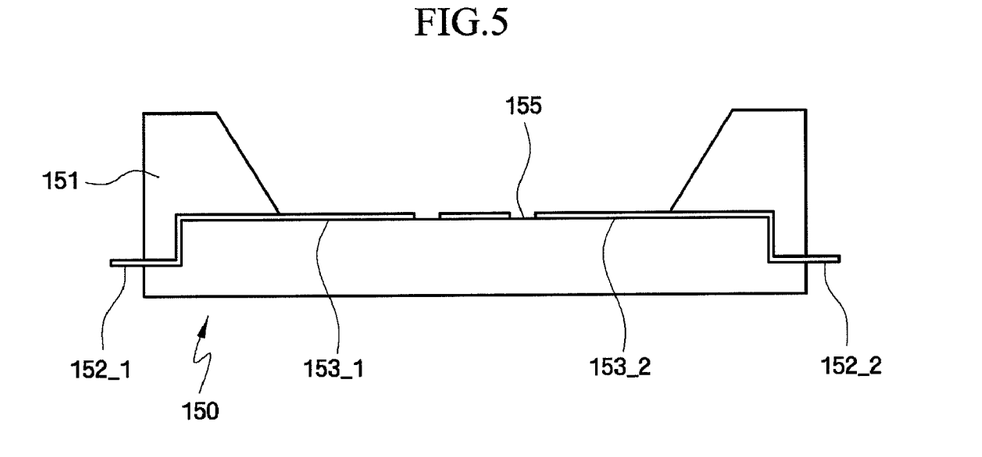
FIGS. 5 to 11 show a method of manufacturing a light unit according to an exemplary embodiment of the present invention.

Referring to FIG. 5, on the bottom surface 155 of the housing 151, the anode electrode 153_1 and the cathode electrode 153_2 are formed. The anode electrode 153_1 and the cathode electrode 153_2 are formed through a patterning process, and are respectively connected to the anode electrode terminal 152_1 and the cathode electrode terminal 152_2 formed on the outer part of the light unit 150.

Figure 6:
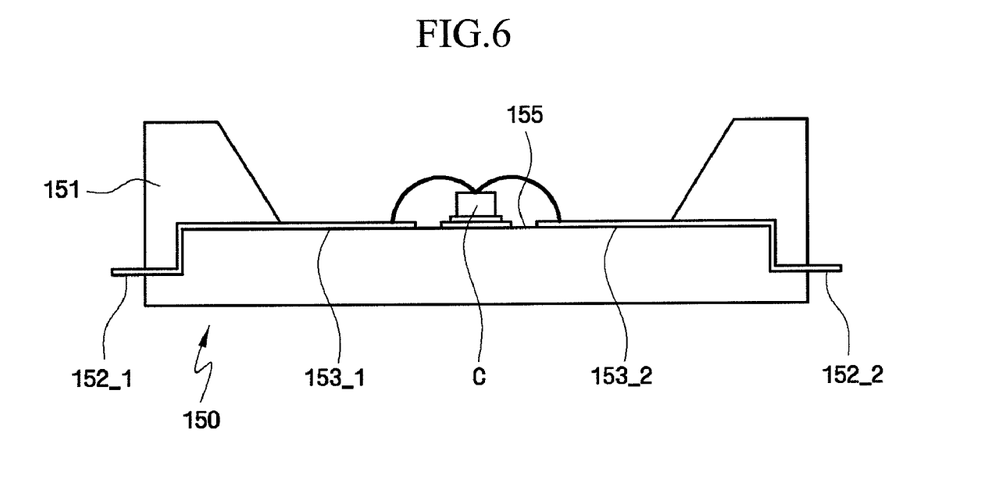

Referring to FIG. 6, on the bottom surface 155 of the housing 151, the light emitting chip C is formed. The light emitting chip C is attached to the bottom surface 155 of the housing 151, and is electrically connected to the anode electrode 153_1 and the cathode electrode 153_2, respectively. That is, the light emitting chip C and the positive and cathode electrodes 153_1 and 153_2 may be connected to each other through a wire bonding process.

Figure 7:
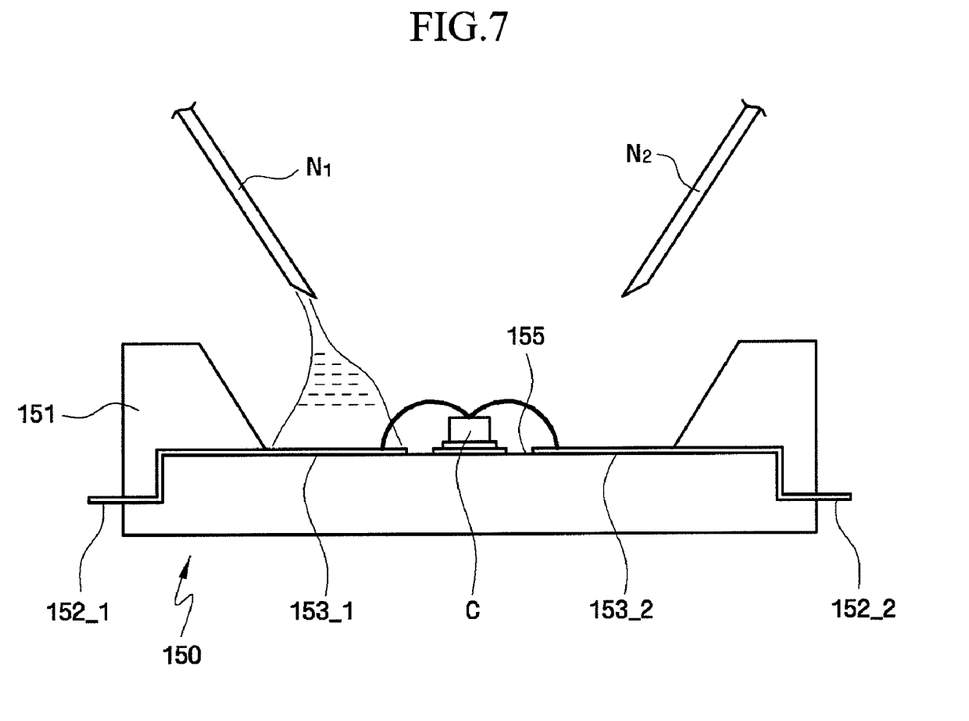

Referring to FIG. 7, the buffer layer 156 is formed on the upper part of the light emitting chip C by using a first nozzle N1. The buffer layer 156 is formed by spraying liquid resin onto the bottom surface of the housing 151 through the first nozzle N1. The buffer layer 156 is applied to completely cover the light emitting chip C.

Figure 8:
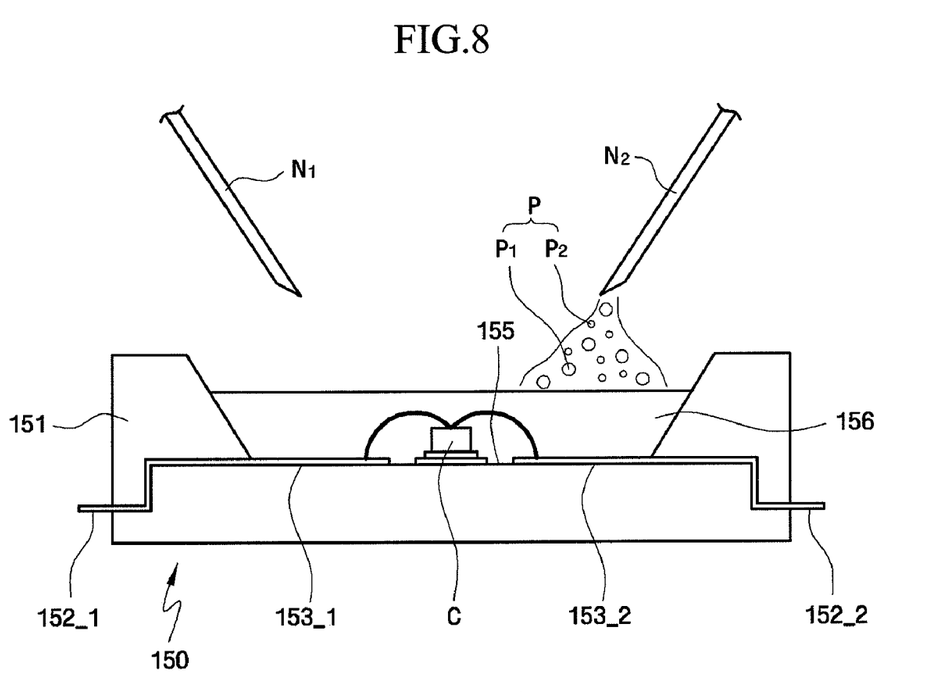

Referring to FIG. 8, the light conversion layer 157 is formed on the upper part of the buffer layer 156 by using a second nozzle N2. The buffer layer 156 is a liquid resin layer, and before the liquid buffer layer 156 is solidified, the light conversion layer 157 that is a liquid resin layer is applied onto the buffer layer 156. In an exemplary embodiment, the light conversion layer 157 includes the liquid resin and the semiconductor particles P. Since the specific gravity of the liquid resin of the light conversion layer 157 is smaller than the specific gravity of the buffer layer 156, the two layers are not mixed with each other, but are separately formed.

The semiconductor particles P are kept in a solvent such as toluene. The semiconductor particles P are separated from the solvent through deposition by using, for example, a centrifugal separator. The semiconductor particles P are again mixed with liquid resin such as, for example, epoxy by dissolving the semiconductor particles P in a solvent such as, for example, chloroform. The liquid resin mixed with the semiconductor particles P is sprayed through the second nozzle N2 to form the light conversion layer 157. The light conversion layer 157 serves as a protection layer contacting an outside element.

Figure 9:
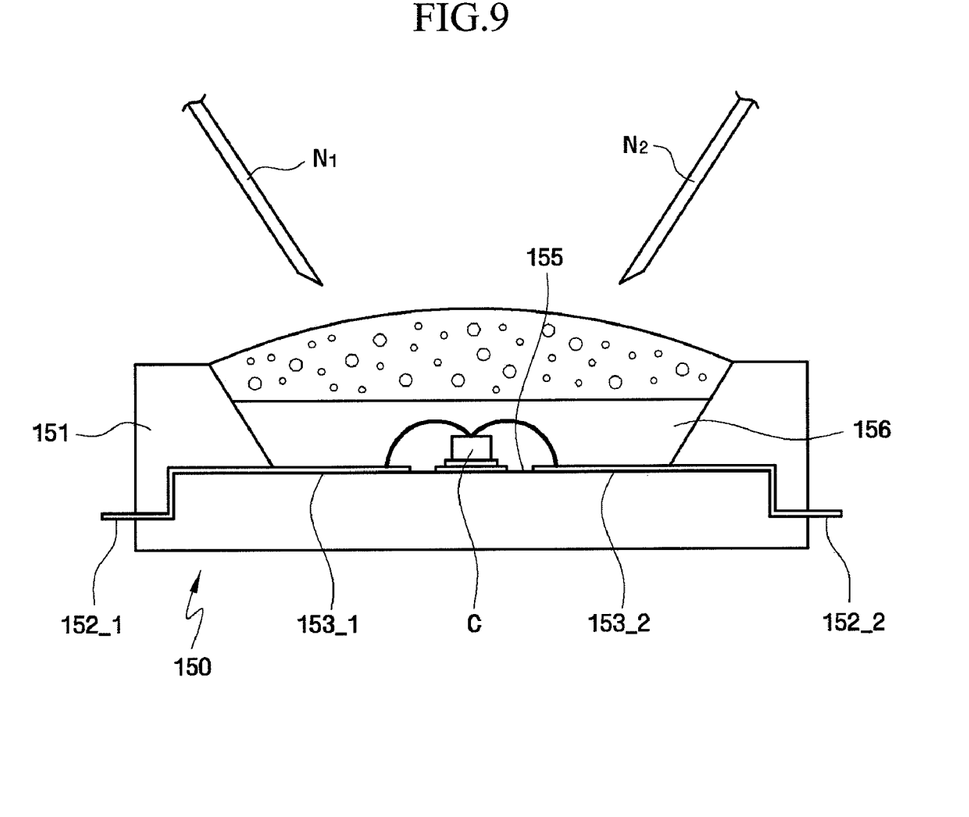

Referring to FIG. 9, the light conversion layer 157 may be applied in the form of a lens by forming the center part of the housing 151 to be higher than other parts. That is, the light conversion layer 157 serves as both a protection layer and a lens for condensing the light emitted from the light emitting chip C. The liquid buffer layer 156 and the light conversion layer 157 are separated from each other due to the difference in specific gravity between the layers, and the light conversion layer 157 can maintain a lens shape by surface tension of the liquid resin.

Figure 10:
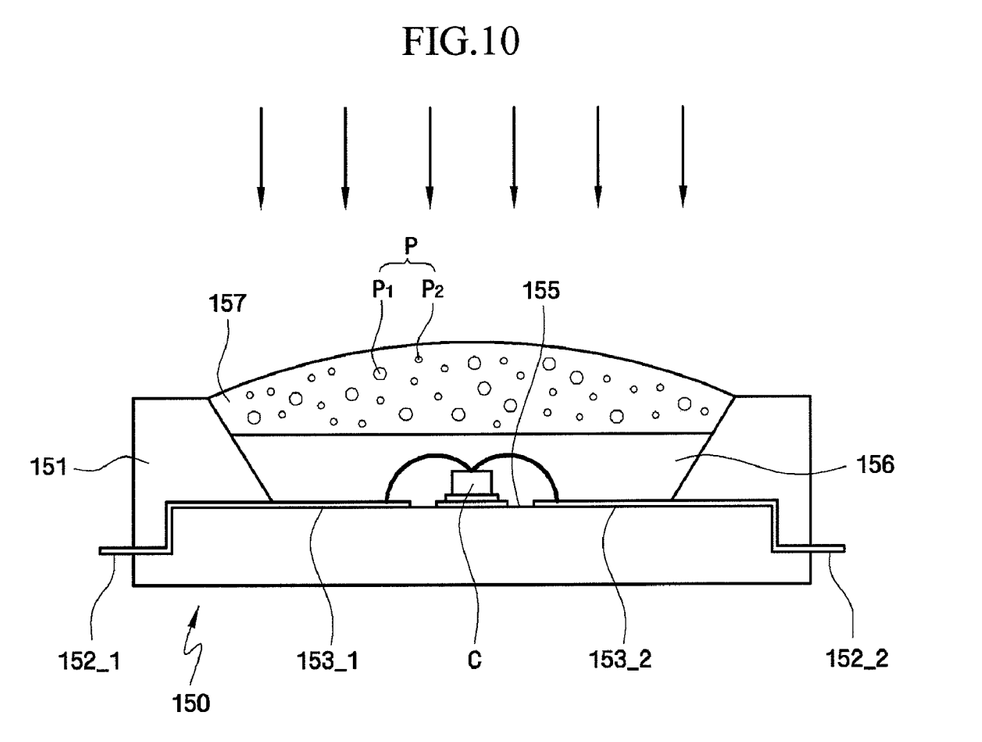

Referring to FIG. 10, the curing of the light unit 150, on which the buffer layer 156 and the light conversion layer 157 are formed, is performed. The buffer layer 156 and the light conversion layer 157, which comprise a liquid resin material, are cured to be a solidified material by heating the layers at a high temperature. The curing is performed at about 150° C. to about 160° C. for about 1 hour to about 2 hours.

Figure 11:
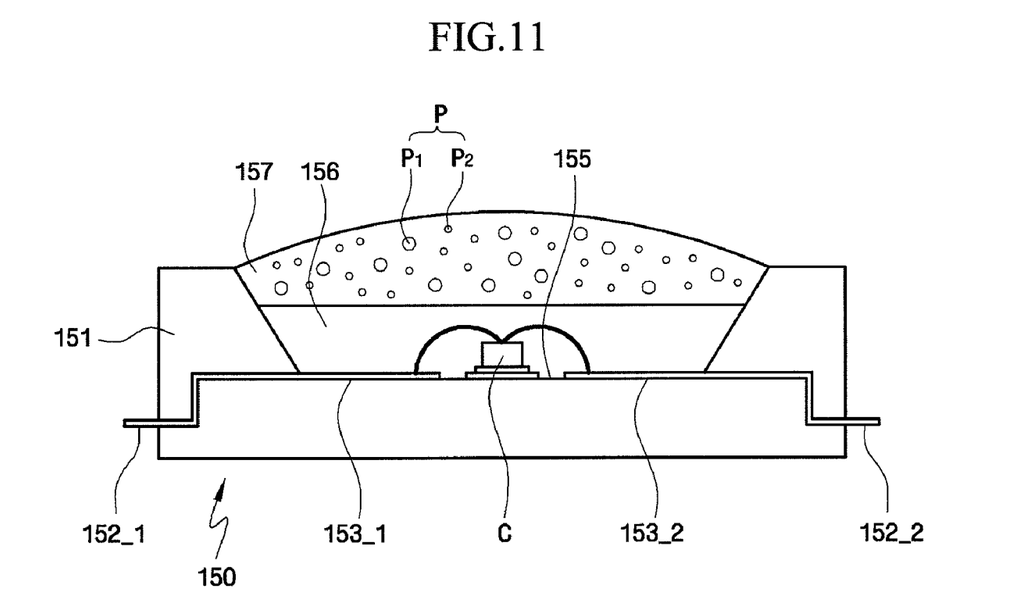

Referring to FIG. 11, curing of the buffer layer 156 and the light conversion layer 157 is completed to provide the completed light unit 150.

Figure 12:
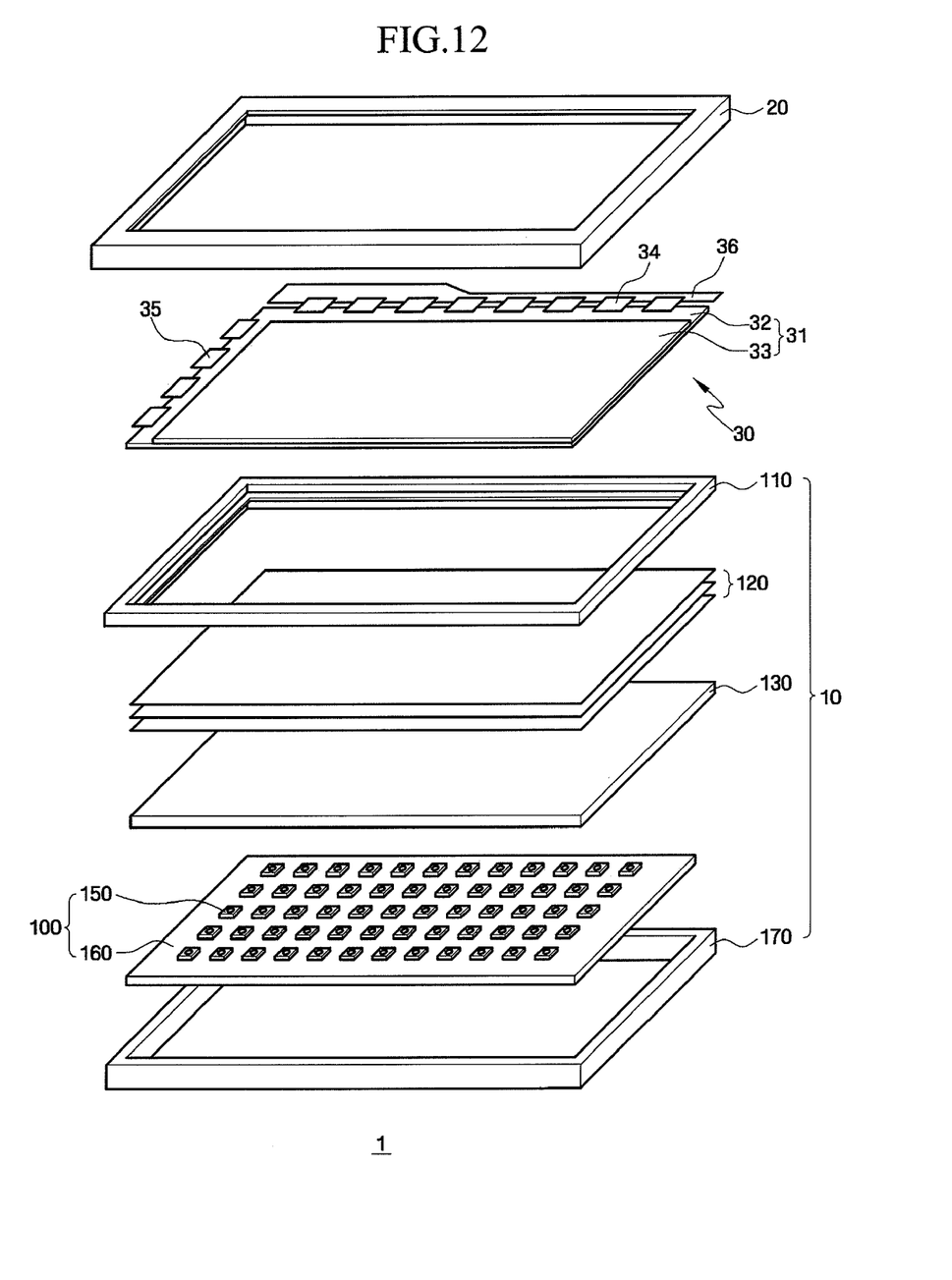
FIG. 12 is an exploded perspective view of a liquid crystal display according to an exemplary embodiment of the present invention.

Referring to FIGS. 1 to 12, a liquid crystal display according to an exemplary embodiment of the present invention is described. FIG. 12 is an exploded perspective view of a liquid crystal display according to an exemplary embodiment of the present invention.

Referring to FIG. 12, the liquid crystal display 1 according to an exemplary embodiment of the present invention includes a liquid crystal panel assembly 30, an upper receptacle 20, and a backlight assembly 10.

The liquid crystal panel assembly 30 includes a liquid crystal panel 31 including a thin film transistor display plate 32, a common electrode display plate 33, and a liquid crystal layer interposed between the two plates, a gate tape carrier package 35, a data tape carrier package 34, and an integrated printed circuit board 36.

The liquid crystal panel 31 includes the thin film transistor display plate 32 including gate lines, data lines, a thin film transistor array, and pixel electrodes, and the common electrode display plate 33 including black matrices and common electrodes. The common electrode display plate 33 is arranged to face the thin film transistor display plate 32. The liquid crystal panel 31 displays images.

The gate tape carrier package 35 is connected to the respective gate lines formed on the thin film transistor substrate 32, and the data tape carrier package 34 is connected to the respective data lines formed on the thin film transistor substrate 32. In an exemplary embodiment, the gate tape carrier package 35 and the data tape carrier package 34 include a wiring pattern where a semiconductor chip is formed on a base film, and a tape automated bonding (TAB) tape is bonded by a TAB technology.

In an exemplary embodiment, on the printed circuit board 160, various driving elements for inputting gate drive signals to the gate tape carrier package 35 and for inputting data drive signals to the data tape carrier package 34 are formed.

The upper receptacle 20 forms an external appearance of the liquid crystal display 1, and includes a space to receive the liquid crystal panel assembly 30. In the center of the upper receptacle 20, an open window for exposing the liquid crystal panel 31 is formed.

The upper receptacle 20 is engaged with the lower receptacle 170 via a middle frame 110.

The backlight assembly 10 includes the middle frame 110, optical sheets 120, a diffusion plate 130, a light assembly 100, and the lower receptacle 170.

The middle frame 110 receives therein the optical sheets 120, the diffusion plate 130, and the light assembly 100, and is fixed to the lower receptacle 170. The middle frame 110 is provided with side walls formed along rectangular edges thereof. In the center of the middle frame 110, an open window for transmitting light having passed through the diffusion plate 130 and the optical sheets 120 is formed.

The optical sheets 120, which diffuse and condense light being transferred from the diffusion plate 130, are arranged on the upper part of the diffusion plate 130, and are received in the middle frame 110. The optical sheets 120 include a first prism sheet, a second prism sheet, and a protection sheet.

The first and second prism sheets improve the brightness of the liquid crystal display in an effective viewing angle range by concentrating light incident at low angles upon the front by refracting the light passed through the diffusion plate 130.

The protection sheet formed on the first and second prism sheets protects the surface of the prism sheets and diffuses light to make the light distribution uniform.

The diffusion plate 130 diffuses light from the light source in respective directions so that a bright defect, which appears as a bright portion in accordance with the shape of the light unit 150, is not shown in front of the liquid crystal display 1. In an exemplary embodiment, the light unit 150 includes a point light source.

The light assembly 100 is a light emitting device supplying the light to the diffusion plate 130, and includes the light unit 150 and the circuit board 160. The light unit 150 is a minimum unit for generating white color, and is connected to the circuit board 160 to receive the driving voltage. The light unit 150 can be fixedly arranged on the upper part of the circuit board 160. On the circuit board 160, a reflective material for reflecting the light emitted from the light unit 150 may be applied.

A process of transferring the light generated from the light unit 150 is described. A blue light generated from the light emitting chip C is converted into a white light when passing through the light conversion layer 157, and thus the light unit 150 emits the white light.

The light emitted from the light unit 150 that is in the form of a point light source passes through the upper diffusion plate 130. The light having passed through the diffusion plate 130 is diffused and converted into the form of a surface light, and then transferred to the optical sheets 120. The path of the light transferred to the optical sheets 120 is adjusted through the optical sheets 120, and then the light passes through the liquid crystal panel 31 to display an image.

In an exemplary embodiment of the present invention, a direct downward type liquid crystal display in which a light unit is located, for example, directly behind the liquid crystal panel is described. However, exemplary embodiments of the present invention can also be applied to an edge type liquid crystal display. In the edge type liquid crystal display, a light guide plate is additionally provided in the lower part of a liquid crystal panel, and a light unit is arranged on the side of the light guide plate. In the edge type liquid crystal display, light is supplied to the liquid crystal panel through the light guide plate.

In the edge type liquid crystal display, a light unit is installed in the side part of a light guide plate. The light generated from the light unit is incident to a side surface of the light guide plate, and is transferred to an upper part through the light guide plate. In this case, the light emitted through the light guide plate changes to surface light, and is transferred to optical sheets. The light passed through the optical sheets passes through the liquid crystal panel to display an image.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A light unit comprising:
    a light emitting chip emitting light;
    a light conversion layer disposed on the light emitting chip, and the light conversion layer including a first resin layer and semiconductor particles distributed on the first resin layer and converting a wavelength of light in accordance with their size, a diameter of the semiconductor particles being in the range of 1~10 nm; and
    a buffer layer interposed between the light emitting chip and the light conversion layer, the buffer layer including a second resin layer,
    wherein the first resin layer has a lower specific gravity than the second resin layer.

2. The light unit of claim 1, wherein the semiconductor particles include an inner core and an outer shell surrounding the inner core, and the inner core comprises CdSe or InGaP, and the outer shell comprises ZnS or CuZnS.

3. The light unit of claim 1, wherein a thickness of the buffer layer is about 60% to about 70% of a whole thickness of the optical conversion layer and the buffer layer.

4. The light unit of claim 1, wherein the light is blue light or ultraviolet rays.

5. The light unit of claim 1, wherein the light conversion layer includes a first light conversion layer and a second light conversion layer, the first light conversion layer including first semiconductor particles and converting the light into red light, and the second light conversion layer including second semiconductor particles having a diameter smaller than that of the first semiconductor particles and converting the light into green light.

6. The light unit of claim 1, wherein the first resin is an epoxy-based material and the second resin is a silicon-based material.

7. A liquid crystal display comprising:
a light unit including a light emitting chip emitting light, a light conversion layer disposed on the light emitting chip and including a first resin layer and semiconductor particles distributed on the first resin layer and converting a wavelength of light in accordance with their size, a diameter of the semiconductor particles being in the range of 1~10 nm, and a buffer layer interposed between the light emitting chip and the light conversion layer, the buffer layer including a second resin layer; and
a liquid crystal panel receiving the light and displaying an image,
wherein the first resin layer has a lower specific gravity than the second resin layer.

8. The liquid crystal display of claim 7, wherein the semiconductor particles include an inner core and an outer shell surrounding the inner core, and the inner core comprises CdSe or InGaP, and the outer shell comprises ZnS or CuZnS.

9. The liquid crystal display of claim 7, wherein the light conversion layer includes a first light conversion layer and a second light conversion layer, wherein the first light conversion layer includes first semiconductor particles and converts the light into red light, and the second light conversion layer includes second semiconductor particles having a diameter smaller than that of the first semiconductor particles and converts the light into green light.

10. The liquid crystal display of claim 7, wherein the light unit is arranged directly behind the liquid crystal panel.

11. The liquid crystal display of claim 7, further comprising a light guide plate guiding the light to a lower part of the liquid crystal panel,
wherein the light unit is formed at a side part of the light guide plate.

12. A method of manufacturing a light unit, comprising:
injecting a first liquid resin on a light emitting chip;
injecting a second liquid resin, including semiconductor particles and having lower specific gravity than the first resin, on the first resin; and
curing the first resin and the second resin to form a buffer layer comprising the first resin and a light conversion layer comprising the second resin,
wherein injecting the second liquid resin is performed before the first liquid resin is solidified.

13. The method of claim 12, wherein curing is performed at a temperature about 150° C. to about 160° C.

14. The method of claim 12, wherein the first resin comprises an epoxy-based material, and the second resin comprises a silicon-based material.

15. The method of claim 12, wherein a diameter of the semiconductor particles is about 1 nm to about 10 nm.

16. The method of claim 15, wherein the semiconductor particles include an inner core and an outer shell surrounding the inner core, and the inner core comprises CdSe or InGaP, and the outer shell comprises ZnS or CuZnS.

17. The method of claim 15, wherein the light conversion layer includes a first light conversion layer and a second light conversion layer, wherein the first light conversion layer includes first semiconductor particles and converts the light into red light, and the second light conversion layer includes second semiconductor particles having a diameter smaller than that of the first semiconductor particles and converts the light into green light.

18. The method of claim 12, further comprising:
forming a liquid crystal panel receiving light and displaying an image; and
forming a light guide plate guiding the light to a lower part of the liquid crystal panel, wherein the light unit is formed at a side part of the light guide plate.

19. The method of claim 12, wherein the first and second liquid resins are cured simultaneously.

* * * * *